(12) United States Patent
Im

(10) Patent No.: US 6,368,945 B1
(45) Date of Patent: Apr. 9, 2002

(54) METHOD AND SYSTEM FOR PROVIDING A CONTINUOUS MOTION SEQUENTIAL LATERAL SOLIDIFICATION

(75) Inventor: James S. Im, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 09/526,585

(22) Filed: Mar. 16, 2000

(51) Int. Cl.$^7$ .......................... H01L 21/20; H01L 21/36
(52) U.S. Cl. .................. 438/487; 438/166; 438/481; 438/486; 438/488
(58) Field of Search ................ 438/149, 166, 438/479, 481, 486, 487, 488, 799

(56) References Cited

U.S. PATENT DOCUMENTS

| | | | | |
|---|---|---|---|---|
| 4,309,225 A | * | 1/1982 | Fan et al. | 438/72 |
| 5,591,668 A | * | 1/1997 | Maegawa et al. | 438/799 |
| 6,169,014 B1 | * | 1/2001 | McCulloch | 438/487 |
| 6,177,301 B1 | * | 1/2001 | Jung | 438/150 |

FOREIGN PATENT DOCUMENTS

| | | | | |
|---|---|---|---|---|
| GB | 2338343 A | * | 12/1999 | H01L/21/20 |
| GB | 2338597 A | * | 12/1999 | H01L/21/20 |
| WO | WO-97/45827 | * | 12/1997 | G09G/3/36 |

OTHER PUBLICATIONS

Im et al., "Phase transformation Mechanisms Involved in Excimer Laser Crystallization Of Amorphous Silicon Films", Appl, Phys. Lett., vol. 63 (14), p. 1969 (1993).*

Im et al., "On the Super Lateral Growth Phenomenon Observed in Excimer Laser–Induced Crystallization of Thin Si Films", Appl, Phys. Lett., vol. 64 (17), p. 2303 (1994).*

Sposili et al., "Sequential Lateral Solidification of Thin Silicon Films on SiO2", Appl, Phys. Lett., vol. 69 (19), p. 2864 (1996).*

Im et al., "Single–Crystal Si Films for Thin–Film Transistor Devices", Appl, Phys. Lett., vol. 70 (25), p. 3434 (1997).*

Sposili et al., "Single–Crystal Si Films Via A Low–Substrate–Temperature Excimer–Laser Crystallization Method", Mat. Res. Symp. Proc., vol. 452, p. 953 (1997).*

Crowder et al., "Low–Temperature Single–Crysta; Si TFT's Fabricated on Si Films processed via Sequential Lateral Solidification", IEEE Electron Device Letter, vol. 19 (8), p. 306 (1998).*

Im et al., "Controlled Super–Lateral Growth of Si Films for Microstructural Manipulation and Optimization", Phys. Stat. Sol. (a), vol. 166, p. 603 (1998).*

* cited by examiner

*Primary Examiner*—Charles Bowers
*Assistant Examiner*—Asok Kumar Sarkar
(74) *Attorney, Agent, or Firm*—Baker Botts L.L.P.

(57) ABSTRACT

A method and system for processing an amorphous silicon thin film sample to produce a large grained, grain boundary-controlled silicon thin film. The film sample includes a first edge and a second edge. In particular, using this method and system, an excimer laser is used to provide a pulsed laser beam, and the pulse laser beam is masked to generate patterned beamlets, each of the patterned beamlets having an intensity which is sufficient to melt the film sample. The film sample is continuously scanned at a first constant predetermined speed along a first path between the first edge and the second edge with the patterned beamlets. In addition, the film sample is continuously scanned at a second constant predetermined speed along a second path between the first edge and the second edge with the patterned beamlets.

23 Claims, 6 Drawing Sheets

METHOD AND SYSTEM FOR PROVIDING A CONTINUOUS MOTION SEQUENTIAL LATERAL SOLIDIFICATION

NOTICE OF GOVERNMENT RIGHTS

The U.S. Government has certain rights in this invention pursuant to the terms of the Defense Advanced Research Project Agency award number N66001-98-1-8913.

FIELD OF THE INVENTION

The present invention relates to a method and system for processing a thin-film semiconductor material, and more particularly to forming large-grained grain boundary-location controlled semiconductor thin films from amorphous or polycrystalline thin films on a substrate using laser irradiation and a continuous motion of the substrate having the semiconductor film being irradiated.

BACKGROUND INFORMATION

In the field of semiconductor processing, there have been several attempts to use lasers to convert thin amorphous silicon films into polycrystalline films. For example, in James Im et al., "Crystalline Si Films for Integrated Active-Matrix Liquid-Crystal Displays," 11 MRS Bulletin 39 (1996), an overview of conventional excimer laser annealing technology is described. In such conventional system, an excimer laser beam is shaped into a long beam which is typically up to 30 cm long and 500 micrometers or greater in width. The shaped beam is stepped over a sample of amorphous silicon to facilitate melting thereof and the formation of grain boundary-controlled polycrystalline silicon upon the resolidification of the sample.

The use of conventional excimer laser annealing technology to generate polycrystalline silicon is problematic for several reasons. First, the polycrystalline silicon generated in the process is typically small grained, of a random micro structure (i.e., poor control of grain boundaries), and having a nonuniform grain sizes, therefore resulting in poor and nonuniform devices and accordingly, low manufacturing yield. Second, in order to obtain acceptable quality grain boundary-controlled polycrystalline thin films, the manufacturing throughput for producing such thin films must be kept low. Also, the process generally requires a controlled atmosphere and preheating of the amorphous silicon sample, which leads to a reduction in throughput rates. Accordingly, there exists a need in the field to generate higher quality thin polycrystalline silicon films at greater throughput rates. There likewise exists a need for manufacturing techniques which generate larger and more uniformly microstructured polycrystalline silicon thin films to be used in the fabrication of higher quality devices, such as thin film transistor arrays for liquid crystal panel displays.

SUMMARY OF THE INVENTION

An object of the present invention is to provide techniques for producing large-grained and grain boundary location controlled polycrystalline thin film semiconductors using a sequential lateral solidification process and to generate such silicon thin films in an accelerated manner.

At least some of these objects are accomplished with a method and system for processing an amorphous or polycrystalline silicon thin film sample into a grain boundary-controlled polycrystalline thin film or a single crystal thin film. The film sample includes a first edge and a second edge. In particular, using this method and system, a laser beam generator is controlled to emit a laser beam, and portions of this laser beam are masked to generate patterned beamlets, each of the beamlets having an intensity which is sufficient to melt the film sample. The film sample is continuously scanned at a first constant predetermined speed along a first path between the first edge and the second edge by the patterned beamlets. In addition, the film sample is continuously scanned at a second constant predetermined speed along a second path between the first edge and the second edge by the patterned beamlets.

In another embodiment of the present invention, the film sample is continuously translated in a first direction so that the fixed patterned beamlets continuously irradiate successive first portions of the film sample along the first path. The first portions are melted while being irradiated. In addition, the film sample is continuously translated in a second direction so that the fixed patterned beamlets irradiate successive second portions of the film sample along the second path. The second portions are melted while being irradiated. Furthermore, after the film sample is translated in the first direction to irradiate a next successive portion of the first path of the film sample, the first portions are cooled and resolidified, and after the film sample is translated in the second direction to irradiate a next successive portion of the second path of the film sample, the second portions are cooled and resolidified.

In yet another embodiment of the present invention, the film sample is positioned so that the patterned beamlets impinge at a first location outside of boundaries of the film sample with respect to the film sample. Also, the film sample can be microtranslated from the first location to a second location before the film sample is scanned along the second path, starting from the second location.

In a further embodiment of the present invention, after the film sample is scanned along the second path, the film sample is translated so that the beamlets impinge a third location which is outside the boundaries of the film sample microtranslated. Thereafter, the film sample can be stepped so that the impingement of the beamlets moves from the third location to a fourth location, the fourth location being outside of the boundaries of the film sample. Then, the film sample is maintained with the patterned beamlets impinging on the fourth location until the film sample stops vibrating and after the movement of the film sample ceases.

In another embodiment of the present invention, the film sample is continuously scanned in a first direction so that the fixed position beamlets scan the first path, and then in a second direction so that the fixed position beamlets scan the second path. After the film sample is translated in the first direction, it is continuously translated at the first constant predetermined speed in a second direction so that the patterned beamlets irradiate the first successive portions of the film sample along the second path, the second direction being opposite to the first direction. Then, the film sample is microtranslated so that the impingement of the beamlets moves from the first location to a second location, the second location being outside of boundaries of the film sample. Thereafter, the film sample is continuously translated at the second constant predetermined speed in a first direction so that the patterned beamlets irradiate second successive portions of the film sample along the second path until the beamlets impinge on the second location, the first direction being opposite to the second direction.

BRIEF DESCRIPTION OF THE DRAWINGS

FIG. 1b shows an embodiment of a method according of the present invention for providing the continuous motion SLS which may be utilized by the system of FIG. 1a.

FIG. 2b shows a diagram of a portion of a crystallized silicon film resulting from the use of the mask shown in FIG. 2a in the system of FIG. 1a.

FIG. 3b shows a diagram of a portion of a crystallized silicon film resulting from the use of the mask shown in FIG. 3a in the system of FIG. 1a.

FIG. 4b shows a diagram of a portion of a crystallized silicon film resulting from the use of the mask shown in FIG. 4a in the system of FIG. 1a.

FIG. 6b a diagram of a portion of a crystallized silicon film resulting from the use of the mask shown in FIG. 6a in the system of FIG. 1a;

FIG. 7 shows another embodiment of a method according of the present invention for providing the continuous motion SLS which may be utilized by the system of FIG. 1a.

DETAILED DESCRIPTION

The present invention provides techniques for producing uniform large-grained and grain boundary location controlled crystalline thin film semiconductors using the sequential lateral solidification process. In order to fully understand those techniques, the sequential lateral solidification process must first be appreciated.

The sequential lateral solidification process is a technique for producing large grained silicon structures through small-scale unidirectional translation of a sample in having a silicon film between sequential pulses emitted by an excimer laser. As each pulse is absorbed by the silicon film, a small area of the film is caused to melt completely and resolidify laterally into a crystal region produced by the preceding pulses of a pulse set.

An advantageous sequential lateral solidification process and an apparatus to carry out that process are disclosed in co-pending patent application Ser. No.09/390,537 (the "'537 application") filed on Sep. 3, 1999, and assigned to the common assignee, the entire disclosure of which is incorporated herein by reference. While the foregoing disclosure is made with reference to the particular techniques described in the '537 application, it should be understood that other sequential lateral solidification techniques could easily be adapted for the use in the present invention.

Figure 1A:
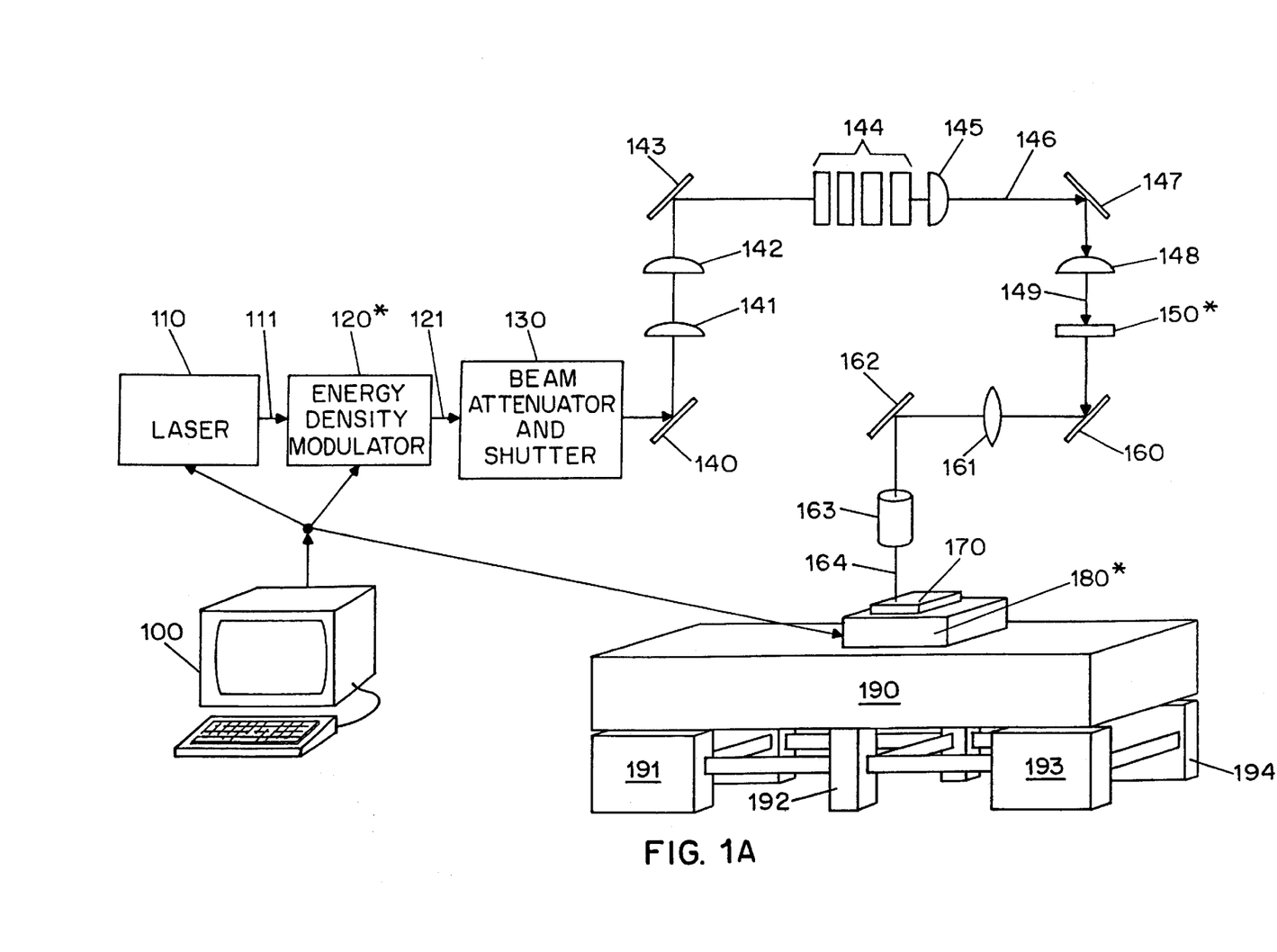
FIG. 1a shows a diagram of an exemplary embodiment of a system for performing a continuous motion solidification lateral solidification ("SLS") according to the present invention.

FIG. 1a shows a system according to the present invention which is capable of implementing the continuous motion SLS process. As also described in the '537 application, the system includes an excimer laser 110, an energy density modulator 120 to rapidly change the energy density of a laser beam 111, a beam attenuator and shutter 130 (which is optional in this system), optics 140, 141, 142 and 143, a beam homogenizer 144, a lens and beam steering system 145, 148, a masking system 150, another lens and beam steering system 161, 162, 163, an incident laser pulse 164, a thin silicon film sample on a substrate 170, a sample translation stage 180, a granite block 190, a support system 191, 192, 193, 194, and a computer 100 which manages X and Y direction translations and microtranslations of the silicon film sample and substrate 170. The computer 100 directs such translations and/or microtranslations by either a movement of a mask within masking system 150 or by a movement of the sample translation stage 180.

As described in further detail in the '537 application, an amorphous silicon thin film sample is processed into a single or polycrystalline silicon thin film by generating a plurality of excimer laser pulses of a predetermined fluence, controllably modulating the fluence of the excimer laser pulses, homogenizing the modulated laser pulses in a predetermined plane, masking portions of the homogenized modulated laser pulses into patterned beamlets, irradiating an amorphous silicon thin film sample with the patterned beamlets to effect melting of portions thereof irradiated by the beamlets, and controllably translating the sample with respect to the patterned beamlets and with respect to the controlled modulation to thereby process the amorphous silicon thin film sample into a single or grain boundary-controlled polycrystalline silicon thin film by the sequential translation of the sample relative to the patterned beamlets and irradiation of the sample by patterned beamlets of varying fluence at corresponding sequential locations thereon. The following embodiments of the present invention will now be described with reference to the foregoing processing technique.

Figure 1B:
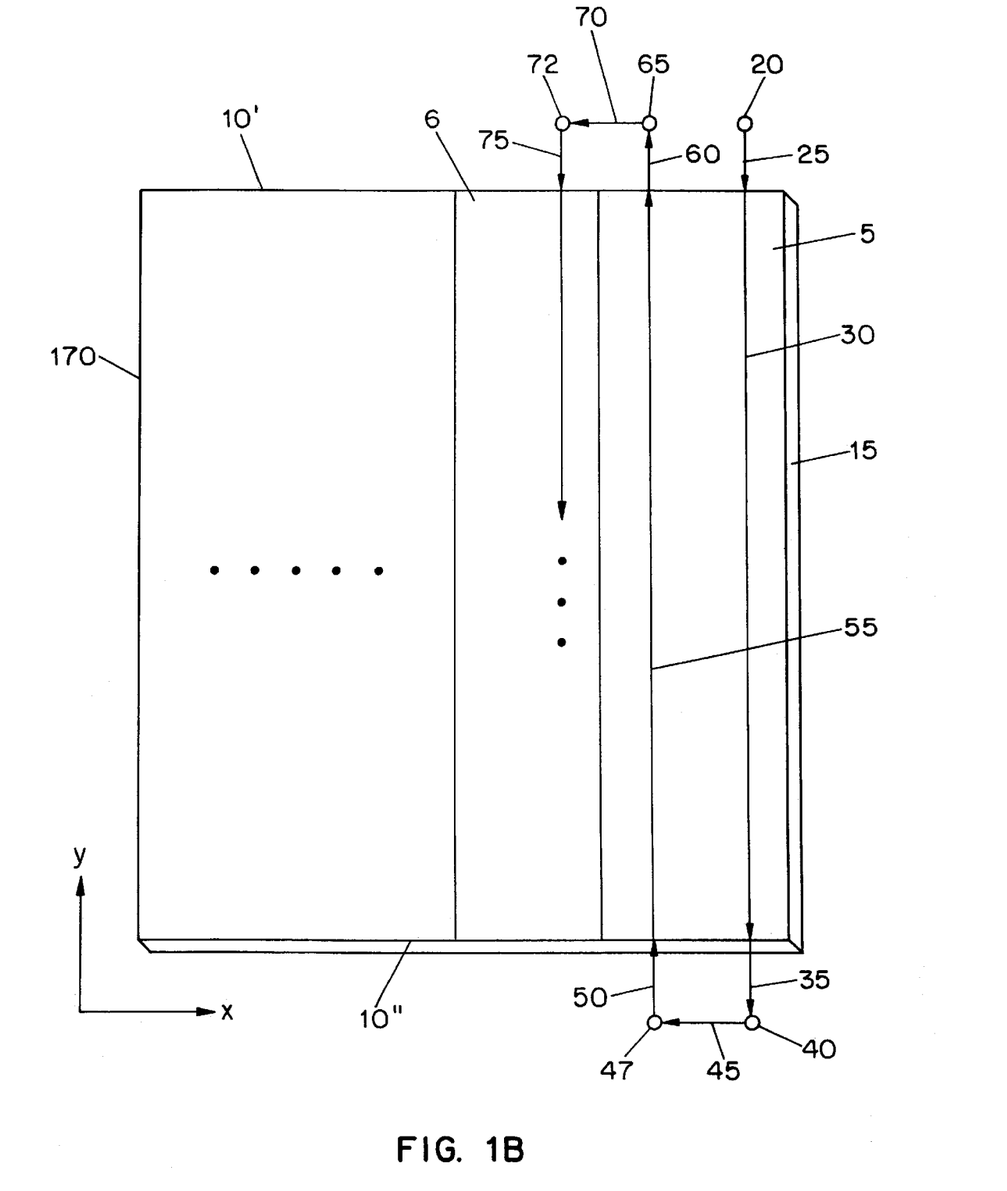

FIG. 1b shows an embodiment of a process according of the present invention for providing the continuous motion SLS which may utilize the system described above. In particular, the computer 100 controls the motion (in the planar X-Y direction) of the sample translation stage 180 and/or the movement of the masking system 150. In this manner, the computer 100 controls the relative position of the sample 170 with respect to the pulsed laser beam 149 and the final pulsed laser beam 164. The frequency and the energy density of the final pulsed laser beam 164 are also controlled by the computer 100.

As described in co-pending patent application Ser. No. 09/390,535 (the "'535 application") filed on Sep. 3, 1999, and also assigned to the common assignee, the entire disclosure of which is incorporated herein by reference, the sample 170 may be translated with respect to the laser beam 149, either by moving the masking system 150 or the sample translation stage 180, in order to grow crystal regions in the sample 170. For example, for the purposes of the foregoing, the length and width of the laser beam 149 may be 2 cm in the X-direction by ½ cm in the Y-direction (e.g., a rectangular shape), but the pulsed laser beam 149 is not limited to such shape and size. Indeed, other shapes and/or sizes of the laser beam 149 are, of course, achievable as is known to those having ordinary skill in the art (e.g., square, triangle, etc.).

Figure 2A:
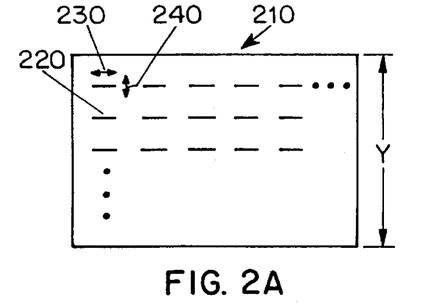
FIG. 2a shows a diagram of a mask having a dashed pattern.
Figure 2B:
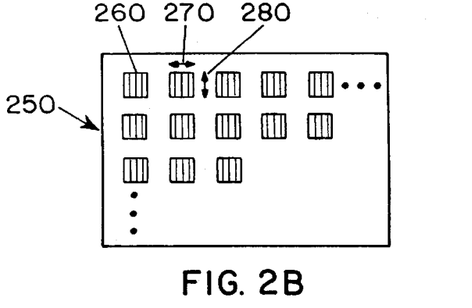
Figure 3A:
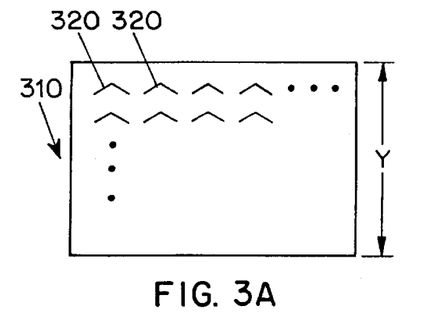
FIG. 3a shows a diagram of a mask having a chevron pattern.
Figure 6A:
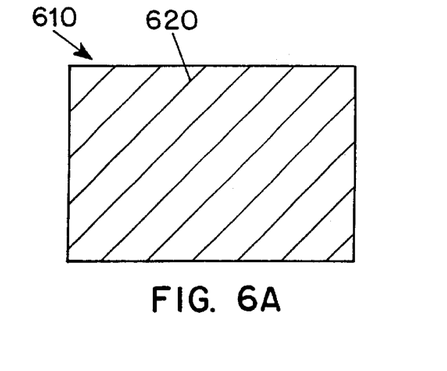
FIG. 6a shows a mask having a diagonal line pattern.

Various masks may also be utilized to create the final pulsed laser beam and beamlets 164 from the transmitted pulsed laser beam 149. Some examples of the masks are shown in FIGS. 2a, 3a, 4a and 6a, a detailed description of which has already been provided in the '535 application. For example, FIG. 2a shows a mask 210 incorporating a regular pattern of slits 220, FIG. 3a shows a mask 310 incorporating a pattern of chevrons 320, and FIG. 6a shows a mask 610 incorporating a pattern of diagonal lines 620. For the sake of simplicity, provided below is a description of the process accordingly to the present invention which utilizes a mask 410 (shown in FIG. 4a) incorporating a pattern of slits 410, each of which may extend as far across on the mask 410 as the homogenized laser beam 149 incident on the mask 410 permits, and should have a width 440 that is sufficiently narrow to prevent any nucleation from taking place in the irradiated region of the sample 170. As discussed in the '535 application, the width 440 may depend on a number of factors, e.g., the energy density of the incident laser pulse, the duration of the incident laser pulse, the thickness of the silicon thin film sample, the temperature and thermal conductivity of the silicon substrate, etc.

In the exemplary embodiment shown in FIG. 1b, the sample 170 has the size of 40 cm in the Y-direction by 30 cm in the X-direction. The sample 170 is conceptually subdivided into a number of columns (e.g., a first column 5, a second column 6, etc.), and the location/dimension of each column is stored in a storage device of the computer 100, and utilized by the computer 100. Each of the columns is dimensioned, e.g., 2 cm in the X-direction by 40 cm in the Y-direction. Thus, the sample 170 may be conceptually subdivided into, e.g., fifteen columns. It is also conceivable to conceptually subdivide the sample 170 into columns having different dimensions (e.g., 3 cm by 40 cm columns, etc.). When the sample 170 is conceptually subdivided into columns, at least a small portion of one column extending for the entire length of such column should be overlapped by a portion of the neighboring column to avoid a possibility of having any unirradiated areas. For example, the overlapped area may have a width of, e.g., 1 µm.

After the sample 170 is conceptually subdivided, a pulsed laser beam 111 is activated (by actuating the excimer laser using the computer 100 or by opening the shutter 130) and produces the pulsed laser beamlets 164 impinging on a first location 20 (from the pulsed laser beam 149). Then, the sample 170 is translated and accelerated in the forward Y-direction under the control of the computer 100 to reach a predetermined velocity with respect to the fixed position beamlets in a first beam path 25. Using the equation:

$$V_{max} = B_w \cdot f,$$

where Vmax is a maximum possible velocity that the sample 170 can be moved with respect to the pulsed beamlets 164, Bw is the width of the pattern of the pulsed laser beamlets 164 (or the width of the envelope of the pulsed beamlets 164), and f is the frequency of the pulsed beamlets 164, the predetermined velocity Vpred can be determined using the following:

$$V_{pred} = V_{max} - K,$$

where K is a constant, and is utilized to avoid a possibility of having any unirradiated areas between adjacent irradiated areas. It is also possible to use the system according to the present invention illustrated in FIG. 1a without utilizing the beam attenuator and shutter 130, since (as described below) due to the continuous translation of the sample 170, the pulsed beamlets 164 does not have to be blocked or turned off.

Figure 5A:
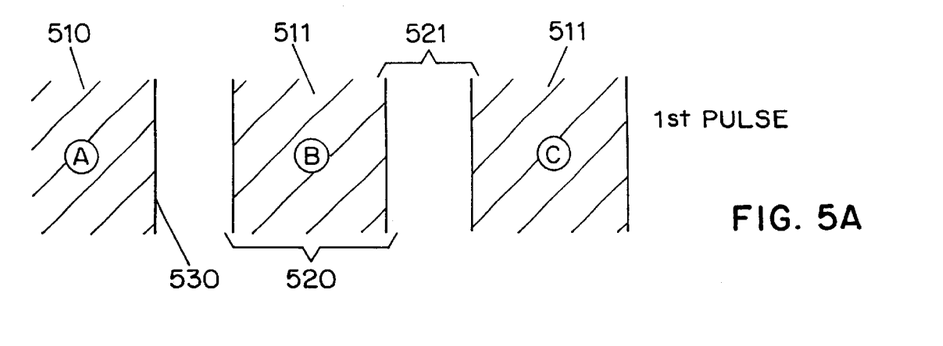
FIG. 5a shows an illustrative diagram showing portions of irradiated areas of a silicon sample using a mask having the line pattern.
Figure 5B:
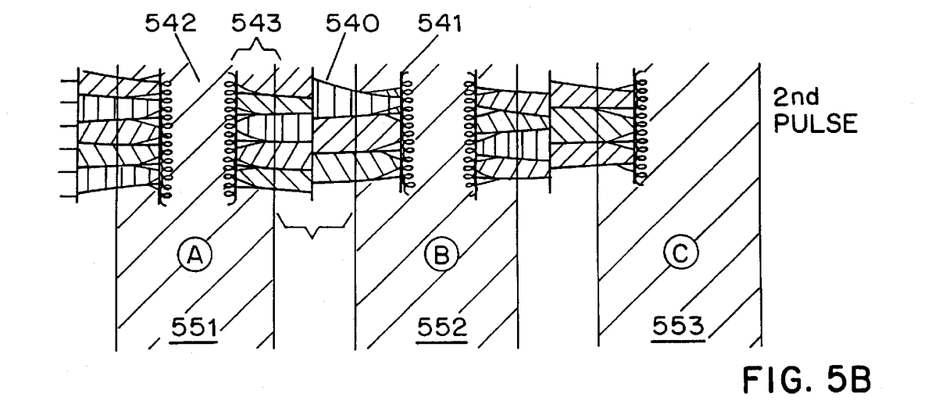
FIG. 5b shows an illustrative diagram of the portions of the irradiated areas of a silicon sample using a mask having a line pattern after initial irradiation and sample translation has occurred, and after a single laser pulse during the method illustrated in FIG. 1b.

The pulsed beamlets 164 reach an upper edge 10' of the sample 170 when the velocity of the movement of the sample 170 with respect to the pulsed laser beam 149 reaches the predetermined velocity Vpred. Then, the sample 170 is continuously (i.e., without stopping) translated in the forward Y-direction at the predetermined velocity Vpred so that the pulsed beamlets 164 continue irradiating successive portions of the sample 170 for an entire length of a second beam path 30. When the pulsed beamlets 164 reach a lower edge 10" of the sample 170, the translation of the sample 170 is slowed with respect to the pulsed beamlets 164 (in a third beam path 35) to reach a second location 40. After the pulsed beamlets 164 continuously and sequentially irradiated the successive portions of the sample 170 along the second beam path 30, these successive portions of the sample 170 are fully melted. It should be noted that after the pulsed beamlets 164 pass the lower edge 10" of the sample 170, a crystalized silicon thin film area 540 (e.g., grain boundary-controlled polycrystalline silicon thin film) forms in the irradiated second beam path 30 area of the sample 170, a portion of which is shown in FIG. 5b. This grain boundary-controlled polycrystalline silicon thin film area 540 extends for the entire length of the second irradiated beam path 30. It should be noted that it is not necessary to shut down the pulsed laser beam 149 after the pulsed beamlets 164 have crossed the lower edge 10" of the sample 170 because it is no longer irradiating the sample 170.

Figure 5C:
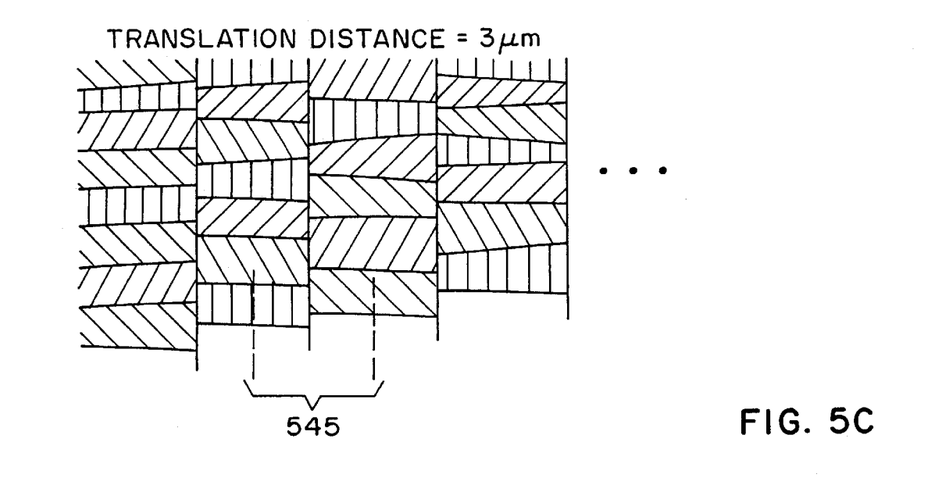
FIG. 5c shows an illustrative diagram of the portions of the crystallized silicon film after a second irradiation has occurred which was generated using the method illustrated in FIG. 1b.

Thereafter, to eliminate the numerous small initial crystals 541 that form at melt boundaries 530 and while the location along the Y-direction of the pulsed beamlets 164 is fixed, the sample 170 is microtranslated for a predetermined distance (e.g., 3 micrometers) in the X-direction along a fourth beam path 45 to reach a third location 47, and is then accelerated in the reverse Y-direction (toward the top edge 10' of the sample 170) under the control of the computer 100 to reach the predetermined velocity of translation with respect to the pulsed beamlets 164 along a fourth beam path 50. The pulsed beamlets 164 reach the lower edge 10" of the sample 170 when the velocity of the sample 170 with respect to the pulsed beamlets 164 reaches the predetermined velocity Vpred. The sample 170 is continuously translated (i.e., without stopping) in the reverse Y-direction at the predetermined velocity Vpred so that the pulsed beamlets 164 irradiate the sample 170 for the entire length of a fifth beam path 55. When the sample 170 is translated under the control of the computer 100 so that the pulsed beamlets 164 reach the upper edge 10' of the sample 170, the continuous translation of the sample 170 is again slowed with respect to the pulsed beamlets 164 (in a sixth beam path 60) to reach a fourth location 65. The result of such irradiation of the fifth beam path 55 is that regions 551, 552, 553 of the sample 170 (shown in FIG. 5b) cause the remaining amorphous silicon thin film 542 and the initial crystallized regions 543 of the polycrystalline silicon thin film area 540 to melt, while leaving the central section 545 of the polycrystalline silicon thin film to remain solidified. After the pulsed beamlets 164 continuously and sequentially irradiated the successive portions of the sample 170 along the fifth beam path 55, these successive portions of the sample 170 are fully melted. Thus, as a result of the laser beam 149's continuous (i.e., without a stoppage) irradiation of the first column 5 for its entire length in the fifth beam path 55, the crystal structure which forms the central section 545 outwardly grows upon solidification of melted regions 542, 542 of the thin film which were formed as a result of the continuous irradiation along the second beam path 30. Thus, a directionally controlled long grained polycrystalline silicon thin film is formed on the sample 170 along the entire length of the fifth beam path 55. A portion of such crystallized structure is illustrated in FIG. 5*c*. Therefore, using the continuous motion SLS procedure described above, it is, possible to continuously form the illustrated crystallized structure along the entire length of the column of the sample 170.

Then, the sample 170 is stepped to the next column 6 to reach a fifth location 72 via a seventh beam path 70, and the sample is allowed to settle at that location to allow any vibrations of the sample 170 that may have occurred when the sample 170 was stepped to the fifth location 72 to cease. Indeed, for the sample 170 to reach the second column 6, it is stepped approximately 2 cm for the columns having a width (in the X-direction) of 2 cm. The procedure described above with respect to the irradiation of the first column 5 may then be repeated for the second column 6. In this manner, all columns of the sample 170 can be properly irradiated with only a minimal settling time which may be required for the sample 170 to settle (and thus wait for the vibrations of the sample 170 to stop). Indeed, the only time that may be required for settling the sample 170 is when the laser has completed the irradiation of an entire column (e.g., the first column 5) of the sample 170, and the sample 170 is stepped to the next column (e.g., the second column 6) of the sample 170. Using the exemplary dimensions of the sample 170 described above (30 cm by 40 cm), since each column is dimensioned 2 cm by 40 cm, there are only 15 columns that must be irradiated for this exemplary sample 170. Accordingly, the number of "step and settle" delays that may occur for the exemplary sample 170 is either 14 or 15.

To illustrate the time savings in using the continuous motion SLS procedure according to the present invention for producing the crystallized silicon thin film, it is possible that the time it takes to translate the sample 170 (which has the sample, column and laser beam dimensions discussed above) for the entire lengths in the various travel paths of the sample 170 is estimated below:

| | |
|---|---|
| the first beam path 25 - | 0.1 seconds, |
| the second beam path 30 - | 0.5 seconds (since the sample 170 does not have to stop and settle for the entire length of a column, and translates continuously), |
| the third beam path 35 - | 0.1 seconds, |
| the fourth beam path 45 - | 0.1 seconds, |
| the fifth beam path 50 - | 0.1 seconds, |
| the sixth beam path 55 - | 0.5 seconds (again because the sample 170 does not have to stop and settle for the entire length of a column, and translates continuously), |
| the seventh beam path 60 - | 0.1 seconds, and |
| the eight beam path 70 - | 0.1 seconds. |

Thus, the total time that it takes to completely irradiate each column 5, 6 of the sample is 1.6 seconds (or at most, e.g., 2 seconds). Thus, for 15 columns of the sample 170, the total time that it takes to form the grain boundary-controlled polycrystalline structure thin film (for the entire sample 170) is approximately 30 seconds.

As indicated above, it is also possible to use different dimensions and/or shapes for cross-sectional area of the laser beam 149. For example, it is possible to use the pulsed laser beam 149 which has the cross-sectional area dimensioned 1 cm by 1 cm (i.e., a square shape). It should be appreciated that it is advantageous to use the diameter of the pulsed beamlets 164 as one of the dimension parameters of the columns. In this instance, the 30 cm by 40 cm sample 170 may be conceptually subdivided into 30 columns, each column being dimensioned 1 cm in the X-direction by 40 cm in the Y-direction (assuming a cross-section of a diameter of the pattern of the pulsed beamlets 164 of 1 cm). Using such a pattern of the pulsed beamlets 164, it may be possible to increase the predetermined velocity Vpred for translating the sample 170, and possibly decrease the total energy of the pulsed laser beam 149. In this manner, instead of irradiating the sample via 15 columns, the system and method according to the present invention would irradiate the sample via 30 columns. Even though it may take longer to step and settle from column to column for 30 columns (as opposed to 15 columns described above), the speed of the sample translation may be increased because, due to the column's smaller width, the intensity of the pulsed laser beam 149 can be greater, as a result of concentrating the laser pulse energy into a smaller beamlet pattern, to provide effective crystallization of the sample 170, and the total time to complete the irradiation of the sample 170 may not be significantly higher than that for the sample which has 15 columns.

Figure 3B:
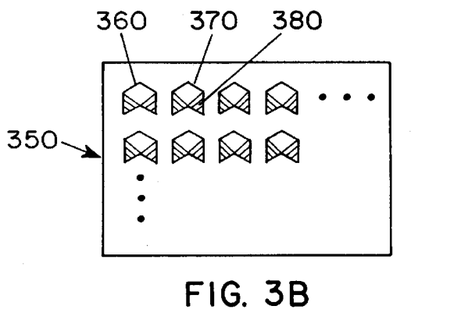
Figure 4A:
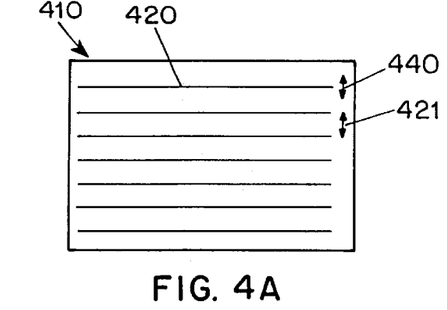
FIG. 4a shows a diagram of a mask having a line pattern.
Figure 4B:
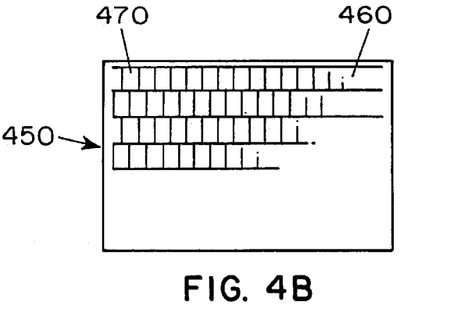
Figure 6B:
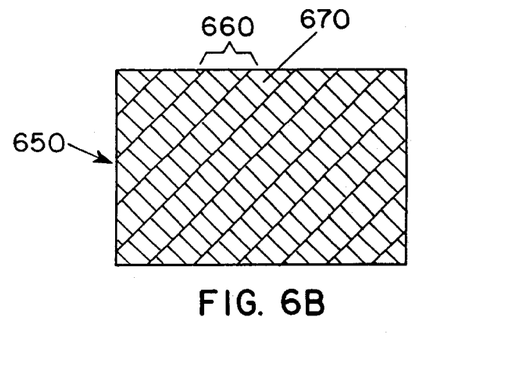

According to the present invention, any mask described and shown in the '535 application may be used for the continuous motion SLS procedure illustrated in FIG. 1*b*. For example, when the mask 310 is used in masking system 150, a processed sample (i.e., a portion 350 shown in FIG. 3*b* having crystallized regions 360) is produced. Each crystal region 360 will consist of a diamond shaped single crystal region 370 and two long grained, directionally controlled grain boundary polycrystalline silicon regions 380 in the tails of each chevron. One may also use a mask 610 (shown in FIG. 6*a*) incorporating a pattern of diagonal slits 620. For this mask 610, when the sample 170 is continuously translated in the Y-direction, and the mask 610 is used in the masking system 150 of FIG. 1*a*, a processed sample (a portion 650 shown in FIG. 6*b* having crystallized regions 660) is produced. Each crystallized region 660 will consist of long grained, crystalline regions with directionally-controlled grain boundaries 670.

It is also possible to irradiate the sample 170 along the columns which are not parallel to the edges of the square sample 170. For example, the columns may extend at approximately 45 degree angle with respect to the edges of the sample 170. The computer 100 stores start and end points of each column and is capable of performing the procedure shown in FIG. 1*b* along parallel columns which are slanted at, e.g., 45 degrees with respect to the edges of the sample 170. The sample 170 can also be irradiated along parallel columns which are slanted at other angles with respect to the edges of the sample 170 (e.g., 60 degrees, 30 degrees, etc.).

Figure 7:
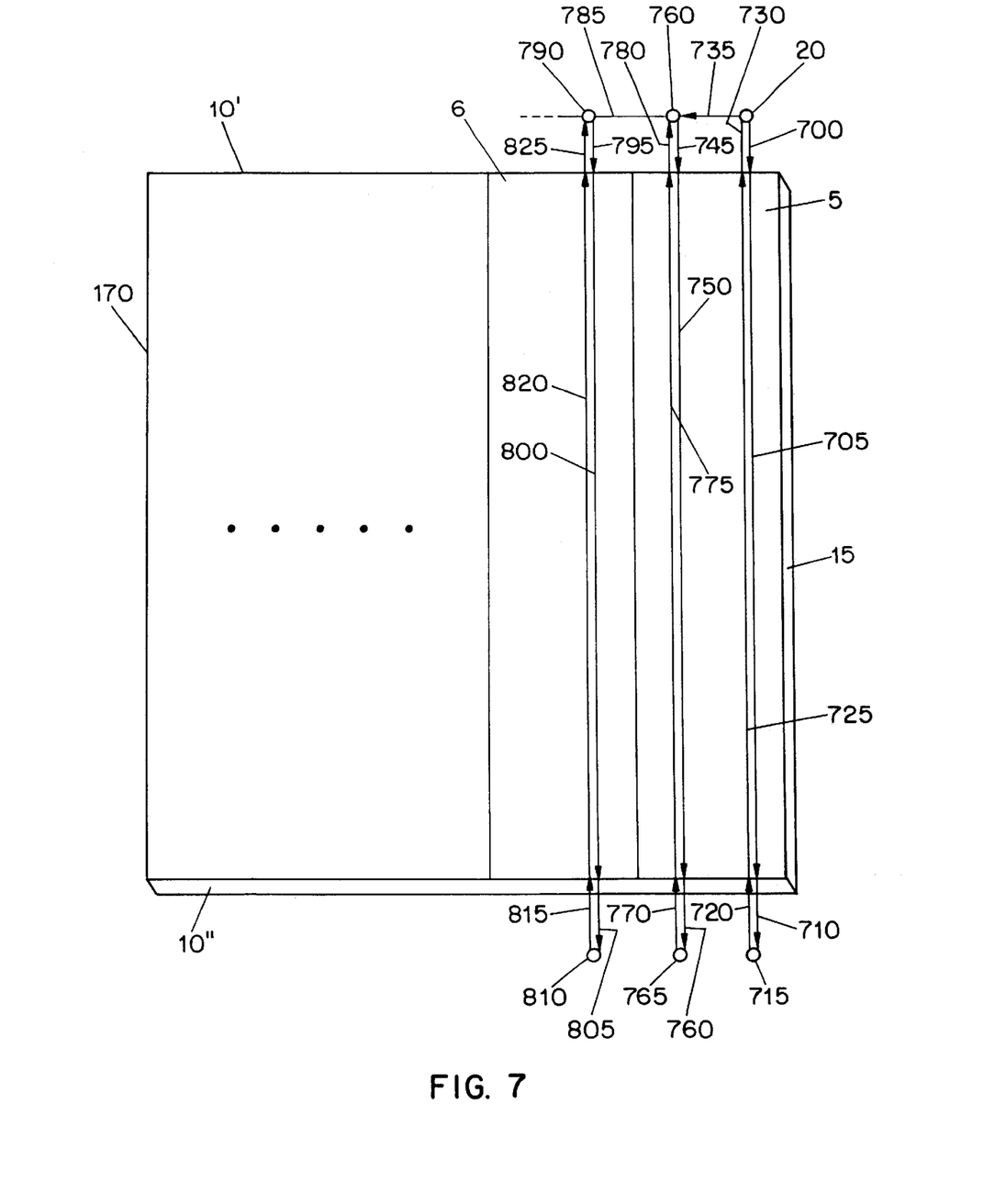

In another exemplary embodiment of the method according to the present invention which is shown in FIG. 7, the sample 170 is conceptually subdivided into a number of columns. After the sample 170 is subdivided, the pulsed laser beam 149 can be turned on (by actuating the excimer laser using the computer 100 or by opening the shutter 130) so that it produces the pulsed beamlets 164 which initially impinge on the first location 20 (similarly to the embodiment illustrated in FIG. 1*b*). Then, the sample 170 is translated and accelerated in the Y-direction under the control of the computer 100 to reach the predetermined sample translation velocity Vpred with respect to the pulsed beamlets 164 in a first beam path 700. The pulsed beamlets 164 (and the beamlets) reach an upper edge 10' of the sample 170 when the velocity of the translation of the sample 170 with respect to the pulsed laser beam 149 reaches the predetermined velocity Vpred. Then, the sample 170 is continuously (i.e., without stopping) translated in the Y-direction at the predetermined velocity Vpred continuously and sequentially so that the pulsed beamlets 164 irradiate the sample 170 for an entire length of a second beam path 705. When the pulsed beamlets 164 reach the lower edge 10" of the sample 170, the translation of the sample 170 is slowed with respect to the pulsed beamlets 164 (in a third beam path 710) to reach a second location 715. It should be noted that after the pulsed beamlets 164 pass the lower edge 10" of the sample 170, the entire portion of the sample 170 along the second beam path 705 has undergone sequential full melting and solidification.

The sample 170, without microtranslating in the X-direction, is translated back in the opposite Y-direction toward the upper edge 10' of the sample 170. In particular, the sample 170 is accelerated in the negative Y-direction under the control of the computer 100 along a fourth beam path 720 to reach the predetermined sample translation velocity Vpred prior to reaching the lower edge 10" of the sample 170. Then, the sample 170 is continuously (i.e., without stopping) translated in the negative Y-direction at the predetermined velocity Vpred so that the pulsed beamlets 164 continuously and sequentially irradiate the sample 170 along the entire length of a fifth beam path 725 (along the path of the second beam path 705). When the pulsed beamlets 164 reach the upper edge 10' of the sample 170, the translation of the sample 170 is slowed with respect to the pulsed beamlets 164 (in a sixth beam path 730) until the beamlets 164 impinge on the first location 20. It should be noted that after the pulsed beamlets 164 pass the upper edge 10' of the sample 170, the entire portion of the sample 170 which was irradiated along the second beam path 705 has undergone sequential melting and solidification. Accordingly, when this pass is completed, the surface of the sample 170 corresponding to the fifth beam path 725 is partially melted and resolidified. In this manner, the resulting film surface may be further smoothed out. In addition, using this technique, the energy output of the pulsed laser beam 149 (and of the pulsed beamlets 164) may be decreased to effectively smooth out the surface of the film. Similarly to the technique of FIG. 1b, a grain boundary-controlled polycrystalline silicon thin film area 540 forms in the irradiated regions of the sample 170, a portion of which is shown in FIG. 5b. This grain boundary-controlled polycrystalline silicon thin film area 540 extends for the entire length of the second and fifth irradiated beam paths 705, 725. Again, it is not necessary to shut down the pulsed laser beam 149 after the pulsed beamlets 164 have crossed the lower edge 10" of the sample 170, and is no longer irradiates the sample 170.

Thereafter, the sample 170 is microtranslated for a predetermined distance (e.g., 3 micrometers) in the X-direction along a seventh beam path 735 until the pulse beamlets impinge on a third location 740, and is then again accelerated in the forward Y-direction (toward the lower edge 10" of the sample 170) under the control of the computer 100 to reach the predetermined velocity Vpred with respect to the pulsed beamlets 164 along an eighth beam path 745. The pulsed beamlets 164 reach an upper edge 10' of the sample 170 when the velocity of translation of the sample 170 with respect to the pulsed beamlets 164 reach the predetermined velocity Vpred. Then, the sample 170 is continuously (i.e., without stopping) translated in the forward Y-direction at the predetermined velocity Vpred so that the pulsed beamlets 164 continuously and sequentially irradiate the sample 170 for an entire length of a ninth beam path 750. When the pulsed beamlets 164 reach the lower edge 10" of the sample 170, the translation of the sample 170 is slowed with respect to the pulsed. beamlets 164 (in a tenth beam path 760) until the pulsed beamlet 164 impinge on a fourth location 765. It should be noted that after the final pulsed laser beam 164 pass the lower edge 10" of the sample 170, the entire portion of the sample 170 which was irradiated along the ninth beam path 750 has undergone sequential full melting and resolidification.

Thereafter, without microtranslating, the direction of the translation of the sample 170 is again reversed (via beam paths 770, 775, 780), and these paths of the sample 170 are again each continuously and sequentially irradiated by continuously translating the sample 170 in the reverse Y-direction (which also extends along the ninth beam path 750) at the predetermined velocity Vpred. Accordingly, when this pass is completed, the surface of the sample 170 corresponding to the beam path 775 is partially melted and resolidified. The surface of these paths 745–780 is smoothed out as a result of the forward and reverse Y-direction translation and irradiation along the same beam path of the sample 170 (without microtranslation). The final product of such procedure is the creation of large-grained, grain boundary-controlled crystalized structure along the entire column (e.g., dimensioned 2 cm by 40 cm) of the sample 170, having a flat (or flatter) surface.

Then, the sample 170 is stepped to the next column (i.e., the second column 6) until the beamlets impinge on a fifth location 790 via another beam path 785, and the sample 170 is allowed to settle to damp out any vibrations of the sample 170 and stage 180 that may have occurred when the sample 170 was stepped where the pulsed beamlets 164 impinge on the fifth location 790. The procedure is repeated for all columns of the sample 170, similarly to the procedure described above and illustrated in FIG. 1b.

Figure 8:
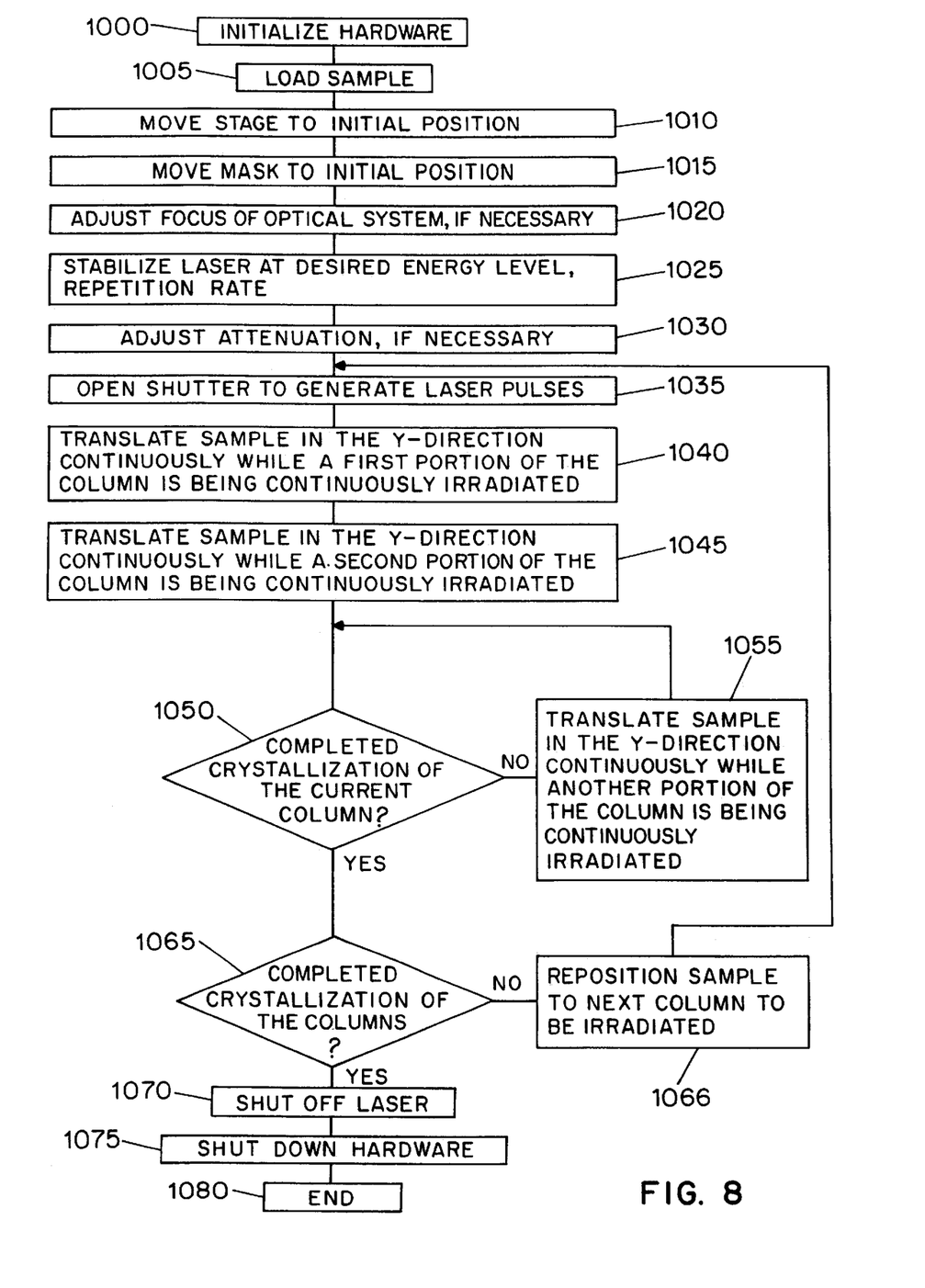
FIG. 8 shows a flow diagram illustrating the steps implemented by the method illustrated in FIG. 1b.

Referring next to FIG. 8, the steps executed by computer 100 to control the thin silicon film crystallization growth method implemented according of the procedure shown in FIG. 1b and/or FIG. 7 is described below. For example, various electronics of the system shown in FIG. 1a are initialized in step 1000 by the computer 100 to initiate the process. A thin amorphous silicon film sample on a substrate 170 is then loaded onto the sample translation stage 180 in step 1005. It should be noted that such loading may be either manual or robotically implemented under the control of the computer 100. Next, the sample translation stage 180 is moved into an initial position in step 1015, which may include an alignment with respect to reference features on the sample 170. The various optical components of the system are adjusted and focused in step 1020, if necessary. The laser is then stabilized in step 1025 to a desired energy level and pulse repetition rate, as needed to fully melt the amorphous silicon sample over the cross-sectional area of each pulsed beamlet incident on the sample in accordance with the particular processing to be carried out. If necessary, the attenuation of the pulsed beamlets 164 is finely adjusted in step 1030.

Next, the shutter can be opened (or the computer activates to turn on the pulsed laser beam 149) in step 1035 to irradiate the sample 170 by the pulsed beamlets 164 and accordingly, to commence the continuous motion sequential lateral solidification method illustrated in FIGS. 1b and 7. The sample is translated in the Y-direction continuously while a first beam path of the sample (e.g., the sample along the second beam path 30) is continuously and sequentially irradiated (step 1040). The sample 170 is translated in the Y-direction continuously at the predetermined velocity Vpred while a second beam path of the sample (e.g., the sample along the sixth beam path 55) is sequentially and continuously irradiated (step 1045). With respect to FIG. 1b, this can be seen by the continuous translation of the sample 170 along the second beam path 30 while the sample 170 is being continuously and sequentially irradiated, then slowing down along the third beam path 35, microtranslating the sample along the X-direction along the fourth beam path 45, waiting for the sample 170 to settle, accelerating along the fifth beam path 50, and then continuously translating the sample 170 along the sixth beam path 55 while the sample 170 is being continuously and sequentially irradiated. In this manner, an entire column of the sample 170 is sequentially irradiated. If some portion of the current column of the sample 170 is not irradiated, the computer 100 controls the sample 170 to continuously translate at the predetermined velocity Vpred in a particular direction so that another portion of the current column of the sample 170 which has not yet been irradiated, is irradiated (step 1055).

Then, if the crystallization of an area of the sample 170 has been completed, the sample is repositioned with respect to the pulsed beamlets 164 in steps 1065, 1066 (i.e., moved to the next column or row—the second column 6) and the crystallization process is repeated on the new path. If no further paths have been designated for crystallization, the laser is shut off in step 1070, the hardware is shut down in step 1075, and the process is completed in step 1080. Of course, if processing of additional samples is desired or if the present invention is utilized for batch processing, steps 1005, 1010, and 1035–1065 can be repeated on each sample. It is well understood by those having ordinary skill in the art that the sample may also be continuously translated in the X-direction, and microtranslated in the Y-direction. Indeed, it is possible to continuously translate the sample 170 in any direction so long as the travel paths of the pulsed beamlets 164 are parallel, continuous and extend from one edge of the sample 170 to another edge of the sample 170.

The foregoing merely illustrates the principles of the present invention. Various modifications and alterations to the described embodiments will be apparent to those skilled in the art in view of the teachings herein. For example, the thin amorphous or polycrystalline silicon film sample 170 may be replaced by a sample having pre-patterned islands of such silicon film. In addition, while the exemplary embodiments above have been described for laser systems in which the laser beams are fixed and preferably not scannable, it should be recognized that the method and system according to the present invention can utilize a pulsed laser beam which can be deflected at a constant speed along a path of a fixed sample. It will thus be appreciated that those skilled in the art will be able to devise numerous systems and methods which, although not explicitly shown or described herein, embody the principles of the present invention, and are thus within the spirit and scope of the present invention.

What is claimed is:

1. A method for processing a silicon thin film sample to produce a crystalline silicon thin film, the film sample having a first edge and a second edge, the method comprising the steps of:
    (a) controlling a laser beam generator to emit a laser beam;
    (b) masking portions of the laser beam to generate patterned beamlets, each of the patterned beamlets impinging on the film sample and having an intensity which is sufficient to melt the film sample;
    (c) continuously scanning, at a first constant predetermined speed, the film sample so that impingement of the patterned beamlets moves along a first path on the film sample between the first edge and the second edge with the patterned beamlets; and
    (d) continuously scanning, at a second constant predetermined speed, the film sample so that impingement of the patterned beamlets moves along a second path on the film sample between the first edge and the second edge with the patterned beamlets,
        wherein at least one of the patterned beamlets has a predetermined width and a predetermined length, the predetermined length being greater than the predetermined width and extending along at least one of the first path and the second path.

2. The method of claim 1,
    wherein step (c) comprises:
        continuously translating the film sample so that the patterned beamlets
        sequentially irradiate first successive portions of the film sample along the
        first path, wherein the first portions are melted while being irradiated, and
    wherein step (d) comprises:
        continuously translating the film sample so that the patterned beamlets
        sequentially irradiate second successive portions of the film sample along
        the second path, wherein the second portions are melted while being
        irradiated.

3. The method of claim 2,
    wherein, after the film sample is translated along the first path to irradiate a next first successive portion of the film sample, the previously irradiated first portion is resolidified, and
    wherein, after the film sample is translated along the second path to irradiate a next second successive portion of the film sample, the previously irradiated second portion is resolidified.

4. The method of claim 1,
    wherein the first path is parallel to the second path,
    wherein, in step (c), the film sample is continuously scanned in a first direction, and
    wherein, in step (d), the film sample is continuously scanned in a second direction,
    the first direction being opposite to the second direction.

5. The method of claim 1, wherein the first edge is located on a side of the film sample which is opposite from a side of the film sample where the second edge is located.

6. The method of claim 2, further comprising the steps of:
    (e) before step (d), positioning the film sample so that the patterned beamlets impinge on at a first location outside of boundaries of the film sample with respect to the film sample; and
    (f) after step (e) and before step (d), microtranslating the film sample so that impingement of the patterned beamlet moves from the first location to a second location,
        wherein step (d) is initiated when the patterned beamlets impinge on the second location.

7. The method of claim 6, further comprising the steps of:
    (g) after step (d), translating the film sample so that the patterned beamlets impinge on a third location which is outside the boundaries of the film sample;
    (h) after step (g), stepping the film sample so that impingement of the patterned beamlets moves from the third location to a fourth location, the fourth location being outside of the boundaries of the film sample; and
    (i) after step (h), maintaining the film sample so that the patterned beamlets impinge on the fourth location until any vibration of the film sample is damped out.

8. The method of claim 7, further comprising the step of:
    (j) after step (i), repeating steps (c) and (d) for respective third and fourth paths of the patterned beamlets on the film sample.

9. The method of claim 2,
wherein, in step (c), the film sample is continuously scanned in a first direction, and
wherein, in step (d), the film sample is continuously scanned in a second direction,
and further comprising the steps of:
- (k) after step (c), continuously translating at the first constant predetermined speed the film sample so that impingement of the patterned beamlets moves along the first path to reach a first location, wherein the patterned beamlets irradiate the first successive portions of the film sample, the film sample being translated in a direction which is opposite to the first direction;
- (l) after step (k) and before step (d), microtranslating the film sample so that impingement of the patterned beamlets moves from the first location to a second location, the second location being outside of boundaries of the film sample; and
- (m) after steps (l) and (d), continuously translating at the second constant predetermined speed the film sample so that impingement of the patterned beamlets moves along the second path to reach the second location, wherein the patterned beamlets irradiate the second successive portions of the film sample, the film sample being translated in a direction which is opposite to the second direction.

10. The method of claim 9, further comprising the steps of:
- (n) after step (m), stepping the film sample so that impingement of the patterned beamlets moves from outside the boundaries of the film sample from the second location to a third location; and
- (o) maintaining the film sample so that the patterned beamlets impinge on the third location until any vibration of the film sample is damped out.

11. The method of claim 10, further comprising the step of:
- (p) after step (o), repeating steps (c), (d), (k), (l) and (m) so that impingement of the patterned beamlets moves along respective third and fourth paths on the film sample.

12. The method of claim 1, wherein step (c) is performed without stopping when the film sample is impinged by the patterned beamlets along the first path.

13. The method of claim 1, wherein step (d) is performed without stopping when the film sample is impinged by the patterned beamlets along the second path.

14. A method for processing a silicon thin film sample to produce a crystalline silicon thin film, the film sample having a first edge and a second edge, the method comprising the steps of:
- (a) controlling a laser beam generator to emit a laser beam;
- (b) masking portions of the laser beam to generate patterned beamlets, each of the patterned beamlets impinging on the film sample and having an intensity which is sufficient to melt the film sample; and
- (c) continuously scanning, at a constant predetermined speed, the film sample so that impingement of the patterned beamiets moves along a predetermined path on the film sample between the first edge and the second edge with the patterned beamlets, wherein the continuous step is performed without stopping when the film sample is impinged by the patterned beamlets along the predetermined path,
wherein at least one of the patterned beamlets has a predetermined width and a predetermined length, the predetermined length being greater than the predetermined width and extending along at least one of the first path and the second path.

15. A method for processing a silicon thin film sample to produce a crystalline silicon thin film, the film sample having a first edge and a second edge, the method comprising the steps of:
- (a) controlling a laser beam generator to emit a laser beam;
- (b) masking portions of the laser beam to generate patterned beamlets, each of the patterned beamlets impinging on the film sample and having an intensity which is sufficient to melt the film sample;
- (c) continuously scanning, at a first constant predetermined speed, the film sample so that impingement of the patterned beamlets moves along a first path on the film sample between the first edge and the second edge with the patterned beamlets; and
- (d) continuously scanning, at a second constant predetermined speed, the film sample so that impingement of the patterned beamlets moves along a second path on the film sample between the first edge and the second edge with the patterned beamlets,
wherein at least one of the first path and the second path extends in a direction which is approximately perpendicular to the direction of grain growth that occurs upon a re-solidification of particular previously-melted portions of the film sample.

16. A method for processing a silicon thin film sample to produce a crystalline silicon thin film, the film sample having a first edge and a second edge, the method comprising the steps of:
- (a) controlling a laser beam generator to emit a pulsed laser beam;
- (b) masking portions of the pulsed laser beam to generate patterned beamlets, each of the patterned beamlets impinging on the film sample and having an intensity which is sufficient to melt the film sample;
- (c) continuously scanning, without microtranslating and at a first constant predetermined speed, the film sample so that impingement of the patterned beamlets moves along a first path on the film sample between the first edge and the second edge with the patterned beamlets; and
- (d) continuously scanning, without microtranslating and at a second constant predetermined speed, the film sample so that impingement of the patterned beamlets moves along a second path on the film sample between the first edge and the second edge with the patterned beamlets.

17. The method according to claim 16, wherein the first path extends in a direction which is approximately perpendicular to the direction of grain growth that occurs upon a re-solidification of particular previously-melted portions of the film sample.

18. A method for processing a silicon thin film sample to produce a crystalline silicon thin film, the film sample having a first edge and a second edge, the method comprising the steps of:
- (a) controlling a laser beam generator to emit a laser beam;
- (b) masking portions of the laser beam to generate patterned beamlets, each of the patterned beamlets impinging on the film sample and having an intensity which is sufficient to melt the film sample; and (c) continuously scanning, without microtranslating and at a constant predetermined speed, the film sample so that impingement of the patterned beamlets moves along a predetermined path on the film sample between the first edge and the second edge with the patterned beamlets, wherein the continuous step is performed without stopping when the film sample is impinged by the patterned beamlets along the predetermined path.

19. The method according to claim 18, wherein the first path extends in a direction which is approximately perpendicular to the direction of grain growth that occurs upon a re-solidification of particular previously-melted portions of the film sample.

20. A method for processing a silicon thin film sample to produce a crystalline silicon thin film, the film sample having at least one region which includes a first boundary and a second boundary, the method comprising the steps of:

(a) controlling a laser beam generator to emit a pulsed laser beam;

(b) masking portions of the pulsed laser beam to generate patterned beamlets, each of the patterned beamlets impinging on the at least one region and having an intensity which is sufficient to melt the at least one region;

(c) continuously scanning, without microtranslating and at a first constant predetermined speed, the at least one region so that impingement of the patterned beamlets moves along a first path on the at least one region between the first boundary and the second boundary with the patterned beamlets; and (d) continuously scanning, without microtranslating and at a second constant predetermined speed, the at least one region so that impingement of the patterned beamlets moves along a second path on the at least one region between the first boundary and the second boundary with the patterned beamlets.

21. The method according to claim 20, wherein the first path extends in a direction which is approximately perpendicular to the direction of grain growth that occurs upon a re-solidification of particular previously-melted portions of the film sample.

22. A method for processing a silicon thin film sample to produce a crystalline silicon thin film, the film sample having at least one region which includes a first boundary and a second boundary, the method comprising the steps of:

(a) controlling a laser beam generator to emit a pulsed laser beam;

(b) masking portions of the pulsed laser beam to generate patterned beamlets, each of the patterned beamlets impinging on the at least one region and having an intensity which is sufficient to melt the at least one region; and (c) continuously scanning, without microtranslating and at a constant predetermined speed, the at least one region so that impingement of the patterned beamlets moves along a predetermined path on the at least one region between the first boundary and the second boundary with the patterned beamlets, wherein the continuous step is performed without stopping when the at least one boundary is impinged by the patterned beamlets along the predetermined path.

23. The method according to claim 22, wherein the first path extends in a direction which is approximately perpendicular to the direction of grain growth that occurs upon a re-solidification of particular previously-melted portions of the film sample.

* * * * *

UNITED STATES PATENT AND TRADEMARK OFFICE
CERTIFICATE OF CORRECTION

PATENT NO.   : 6,368,945 B1
DATED        : April 9, 2002
INVENTOR(S)  : Im

It is certified that error appears in the above-identified patent and that said Letters Patent is hereby corrected as shown below:

Title page,
Item [56], References Cited, OTHER PUBLICATIONS, under "Im et al." (first occurrence), "transformation" should read -- Transformation --; and "Of" should read -- of --
Under "Sposili et al." (first occurrence), "SiO2" should read -- $SiO_2$ --
Under "Sposili et al." (second occurrence), "Via A" should read -- via a --
Under "Crowder et al.," "Single-Crysta;" should read -- Single-Crystal --

Column 2,
Line 65, "solidification" should read -- sequential --

Column 3,
Line 35, "1a;" should read -- 1a. --

Column 4,
Line 3, "'537" should read -- '537 --

Column 5,
Line 8, "accordingly" should read -- according --
Line 62, "attentuator" should read -- attenuator --
Line 64, "does" should read -- do --

Column 6,
Lines 11 and 55, "irradiated" should read -- irradiate --
Line 16, "crystalized" should read -- crystallized --

Column 7,
Line 2, "is, possible" should read -- is possible --
Table, "path25" should read -- path 25 --
Line 57, "cross-sectional" should read -- the cross-sectional --

Column 8,
Line 33, "directionally-" should read -- directionally --

Column 9,
Line 41, "is" should be deleted

UNITED STATES PATENT AND TRADEMARK OFFICE
CERTIFICATE OF CORRECTION

PATENT NO. : 6,368,945 B1
DATED : April 9, 2002
INVENTOR(S) : Im

It is certified that error appears in the above-identified patent and that said Letters Patent is hereby corrected as shown below:

Column 10,
Line 15, "crystalized" should read -- crystallized --
Line 49, "activates" should read -- activated --

Column 12,
Line 42, "at" should be deleted

Column 13,
Line 62, "beamiets" should read -- beamlets --

Column 14,
Lines 30 and 57, "previously-melted" should read -- previously melted --

Column 15,
Line 14, "previously-melted" should read -- previously melted --

Column 16,
Lines 7 and 33, "previously-melted" should read -- previously melted --

Signed and Sealed this

Twenty-ninth Day of July, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,368,945 B1  Page 1 of 1
DATED : April 9, 2002
INVENTOR(S) : James S. Im It is certified that error appears in the above-identified patent and that said Letters Patent is hereby corrected as shown below:

<u>Title page,</u>
Item [56], References Cited, U.S. PATENT DOCUMENTS, insert:
-- 5,893,990    April 13, 1999    Tanaka
   5,145,808    Sept. 8, 1992    Sameshima et al. --

FOREIGN PATENT DOCUMENTS, insert:
-- 0681316    11/1995    (EP) --

Signed and Sealed this

Ninth Day of September, 2003

JAMES E. ROGAN
*Director of the United States Patent and Trademark Office*